US007501884B2

United States Patent
Chen

(10) Patent No.: US 7,501,884 B2
(45) Date of Patent: Mar. 10, 2009

(54) CAPACITIVE CIRCUIT EMPLOYING LOW VOLTAGE MOSFETS AND METHOD OF MANUFACTURING SAME

(75) Inventor: Chung-Hui Chen, HsinChu (TW)

(73) Assignee: Taiwan Semiconductor Manufacturing Company Ltd., Hsinchu (TW)

(*) Notice: Subject to any disclaimer, the term of this patent is extended or adjusted under 35 U.S.C. 154(b) by 638 days.

(21) Appl. No.: 10/866,155

(22) Filed: Jun. 11, 2004

(65) Prior Publication Data

US 2005/0275449 A1 Dec. 15, 2005

(51) Int. Cl.
*G01F 1/10* (2006.01)
*G01F 3/00* (2006.01)

(52) U.S. Cl. .......... 327/543

(58) Field of Classification Search .......... 327/530, 327/538, 540, 541, 543

See application file for complete search history.

(56) References Cited

U.S. PATENT DOCUMENTS 5,107,201 A * 4/1992 Ogle .......... 324/72.5
5,338,701 A 8/1994 Hsu et al. .......... 438/110
5,544,102 A * 8/1996 Tobita et al. .......... 365/189.09
5,796,296 A * 8/1998 Krzentz .......... 327/545
5,847,581 A * 12/1998 Allen .......... 326/81
5,917,230 A 6/1999 Aldrich .......... 257/532
6,140,693 A 10/2000 Weng et al. .......... 257/532
6,306,745 B1 10/2001 Chen .......... 438/599
6,530,887 B1 * 3/2003 Gilbert et al. .......... 600/459
6,549,458 B1 * 4/2003 Rao et al. .......... 365/185.08
6,737,912 B2 * 5/2004 Otsuka .......... 327/566
2005/0073354 A1 * 4/2005 Abadeer et al. .......... 327/530

* cited by examiner

*Primary Examiner*—Quan Tra
(74) *Attorney, Agent, or Firm*—Baker & McKenzie LLP

(57) ABSTRACT

Disclosed herein are a capacitive circuit for use on a semiconductor substrate, and related method of manufacturing the same. In one aspect, the capacitive circuit includes a plurality of MOSFETs each having their respective source and drain electrically coupled together, where the plurality of MOSFETs are series-coupled to each other by electrically coupling a gate of one of the plurality to the coupled source/drain of another of the plurality. In this embodiment, the circuit also includes a power supply electrically coupled to the plurality of MOSFETs, where a coupled source/drain of one of the plurality of MOSFETs at a first end of the series is electrically coupled to a first terminal of the power supply, and a gate of another of the plurality of MOSFETs at a second end of the series is electrically coupled to a second terminal of the power supply. The circuit also includes a plurality of resistive elements each electrically parallel-coupled across corresponding ones of the plurality of MOSFETs.

22 Claims, 3 Drawing Sheets

N1
100
M1
M3
M2
M4
N2

CAPACITIVE CIRCUIT EMPLOYING LOW VOLTAGE MOSFETS AND METHOD OF MANUFACTURING SAME

TECHNICAL FIELD

Disclosed embodiments herein relate generally to semiconductor integrated circuits, and more particularly to a capacitive circuit capable of functioning as a decoupling capacitor formed on and in a semiconductor substrate using low voltage MOSFETs in a high voltage application.

BACKGROUND

In recent years there continues to be dramatic density increases in integrated circuit technology. For example, the minimum feature size of lithography, such as the size of MOSFETs, has been reduced to one micrometer and below. In the fabrication of precision capacitors in conjunction with FET devices on the same chip at these reduced dimensions, it is increasingly difficult to maintain such parameters as low voltage and temperature coefficients and low leakage current.

Among typical integrated circuits, some circuit components are designed and manufactured to operate at high voltages (e.g., 3.3 V), while others are designed and constructed to operate at low voltage 1.8 V. However, since low voltage MOSFETs are typically less expensive to manufacture, and in many cases are already present in existing circuit patterns, it is desirable to employ low voltage MOSFETs in place of high voltage MOSFETs in as many application as possible. In addition, MOSFETs have in some cases been employed for use as other devices, rather than as transistor devices. For example, many circuit designs have employed the capacitive properties of MOSFETs to form capacitors in integrated circuits without the need to specifically manufacture capacitors for these uses. When employed, such approaches can significantly reduce the manufacturing time and overall costs of forming integrated circuits.

Unfortunately, many conventional applications for MOSFETs employed in this manner are operated under high voltage, thus typically requiring the use of high voltage MOSFETs (i.e., thicker gate dielectrics to achieve higher breakdown voltage) rather than low voltage devices. Since the use of high voltage MOSFETs typically increases overall manufacturing costs, as mentioned above, the capability of employing low voltage devices in high voltage circuits would be advantageous in many respects. A particular benefit would be the use of such low voltage MOSFETs in place of capacitors where many such MOSFETs are readily available (and perhaps are not being used in the particular circuit design), obviating the need to specifically form high voltage MOSFETs or specialized capacitors.

BRIEF SUMMARY

Disclosed herein are a capacitive circuit for use on a semiconductor substrate, and related method of manufacturing the same. In one aspect, the capacitive circuit includes a plurality of MOSFETs each having their respective source and drain electrically coupled together, where the plurality of MOSFETs are series-coupled to each other by electrically coupling a gate of one of the plurality to the coupled source/drain of another of the plurality. In this embodiment, the circuit also includes a power supply electrically coupled to the plurality of MOSFETs, where a coupled source/drain of one of the plurality of MOSFETs at a first end of the series is electrically coupled to a first terminal of the power supply, and a gate of another of the plurality of MOSFETs at a second end of the series is electrically coupled to a second terminal of the power supply. The circuit also includes a plurality of resistive elements each electrically parallel-coupled across corresponding ones of the plurality of MOSFETs.

In another aspect, an embodiment of a method of manufacturing a capacitive circuit on a semiconductor wafer includes forming a plurality of MOSFETs on and in a semiconductor substrate, where each of the MOSFETs is separated by field oxide regions and each has a source region and a drain region with a channel region defined therebetween, a gate dielectric over the channel, and a gate electrode over the gate dielectric. The method also includes electrically coupling the source region to the corresponding drain region of each of the plurality of MOSFETs, and series-coupling each of the plurality of MOSFETs by electrically coupling a gate of one of the plurality to the coupled source/drain of another of the plurality. In such an embodiment, the method further includes electrically coupling a first terminal of a power supply to a coupled source/drain of one of the plurality of MOSFETs at a first end of the series of MOSFETs, and coupling a second terminal of the power supply to a gate of another of the plurality of MOSFETs at a second end of the series. The method still further includes electrically coupling a plurality of resistive elements in parallel across corresponding ones of the plurality of MOSFETs.

BRIEF DESCRIPTION OF THE DRAWINGS

For a more complete understanding of the principles disclosure herein, and the advantages thereof, reference is now made to the following descriptions taken in conjunction with the accompanying drawings, in which.

DETAILED DESCRIPTION OF PREFERRED EMBODIMENTS

Figure 1:
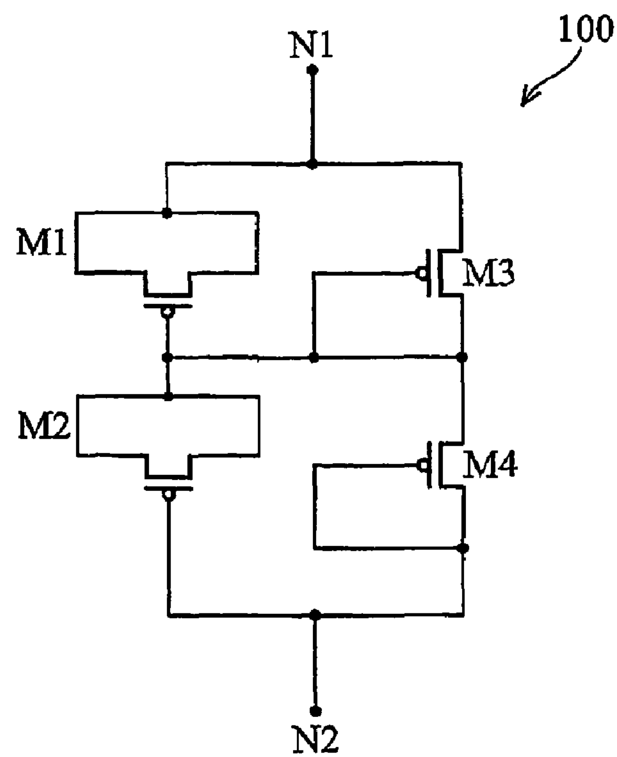
FIG. 1 illustrates one embodiment of a capacitive circuit constructed according to the disclosed principles.

Referring initially to FIG. 1, illustrated is one embodiment of a capacitive circuit 100 constructed according to the disclosed principles. A shown, the circuit 100 includes four metal-oxide-semiconductor field-effect transistors (MOSFETs) M1, M2, M3, M4 coupled together in a unique manner in order to create a decoupling capacitor for use in circuitry formed in semiconductor wafers. As mentioned above, decoupling capacitors are commonly added/formed for use within semiconductor circuitry formed in semiconductor substrates for a variety of reasons, however such capacitors are typically expensive to incorporate.

Alleviating such expensive designs is the circuit 100, which includes two sets of low voltage MOSFETs (M1, M2 and M3, M4). As used herein, a "low voltage MOSFET" is defined to include MOSFETs configured to be operated at about 1.8 volts (±10%) for a period of about 10 years. An example of such a MOSFET includes a silicon dioxide (SiO2) gate dielectric with a thickness of about 40 Å, Conversely, a "high voltage MOSFET" is defined to include MOSFETs configured to be operated at about 3.3 volts (±10%) for a period of about 10 years. An example of such a MOSFET includes a silicon dioxide (SiO2) gate dielectric with a thickness of about 70 Å. Of course, if a low voltage MOSFET were operated under such "high voltage" conditions, it would likely not last close to the above specifications. However, since low voltage MOSFETs are typically less expensive to manufacture, and in many cases are already present in existing circuit patterns, the capability of employing such low voltage MOSFETs in high voltage application would be extremely advantageous.

The first set of MOSFETs M1, M2 have their respective sources and drains (S/D) electrically coupled together. In addition, the first set is series-coupled to each other ("stacked") by electrically coupling the coupled S/D of M1 to a positive terminal of a power supply (at N1) and the gate of M1 to the coupled S/D of M2. The gate of M2 is then electrically coupled to a negative/ground terminal of the power supply (at N2). In this embodiment, the MOSFETs M1, M2 are PMOS devices, since the S/D of both M1 and M2 are oriented towards the positive terminal of the power supply, and their gates are oriented towards ground. Of course, the orientation of M1 and M2 may be reversed if NMOS devices are employed, as discussed in greater detail with reference to FIG. 4.

Also illustrated in the circuit 100 are resistive elements each coupled across MOSFETs M1 and M2. In the illustrated embodiment, the resistive elements are MOSFETs M3 and M4, which are respectively coupled across MOSFETs M1 and M2. More specifically, in this embodiment, one of the S/D of M3 is coupled to the S/D of M1, while the gate and other S/D of M3 are coupled to the gate of M1 and the S/D of M2. Likewise, one of the S/D of M4 is coupled to the gate of M1 and S/D of M2, while the gate and other S/D of M4 are coupled to the gate of M2. By coupling M3 and M4 in this manner, one of the S/D and the gate of both M3 and M4 are respectively coupled together to create an active resistance across each device's channel (i.e., through their gate dielectric). Thus, the resistive nature of the channel across the S/D regions of MOSFETs M3 and M4 may be employed as resistive elements to form a voltage divider across the series-coupled MOSFETs M1 and M2, when coupled across M1 and M2 as described above (and illustrated in FIG. 1).

Figure 2:
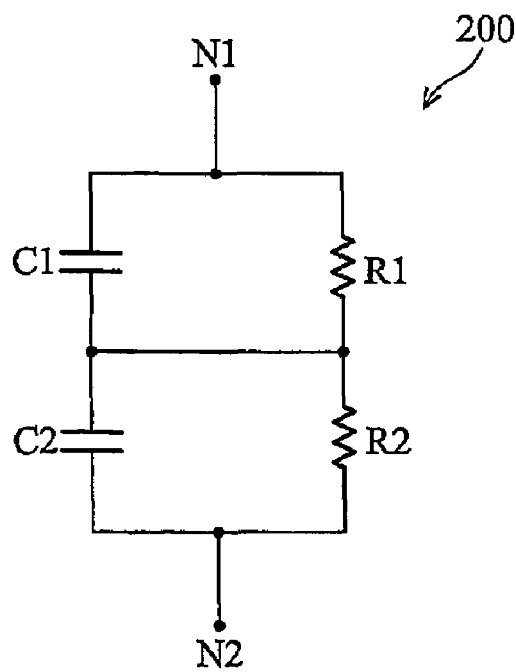
FIG. 2 illustrates a capacitive circuit that is an effective equivalent to the circuit illustrated in FIG. 1.

Turning now to FIG. 2, illustrated is a capacitive circuit 200 that is an effective equivalent to the circuit 100 illustrated in FIG. 1. Specifically, the dielectric gate dielectrics of the series-coupled MOSFETs M1 and M2 each function as capacitors C1, C2 when a DC voltage is applied across them via nodes N1 and N2. Similarly, the gate dielectrics of the parallel-coupled MOSFETs M3 and M4 each function as resistances R1, R2 when a DC voltage is so applied.

With this type of electrical connection, when R1 is parallel to C1 and R2 is parallel to C2, the equivalent capacitance of the circuit 200 can be expressed using equation (1).

$$C_{eq}=(R1//C1)+(R2//C2) \tag{1}$$

Moreover, if R1 and R2 are substantially equal in value (R), and C1 and C2 are substantially equal in value (C), then equation (1) may be simplified to equation (2). Of course, if more than two resistive elements are present, the multiplier is changed from 2 to the number of resistive elements employed in the circuit 200 (see below).

$$C_{eq}=2\times(R//C) \tag{2}$$

Applying the standard relationship found in RC circuits, equation (3) may then be derived.

$$C_{eq}=2\times\frac{\left(R\times\frac{1}{C}\right)}{\left(R+\frac{1}{C}\right)} \tag{3}$$

Moreover, by ensuring that the frequency of the circuit is low and the value of R is high, the R values in equation (3) become negligible, and equation (4) remains.

$$C_{eq}=2\times\left(\frac{1}{C}\right) \tag{4}$$

As may be seen from equation (4), when C1=C2 and R1=R2, then each of C1 and C2 are equal to one-half of the equivalent capacitance ($C_{eq}$). As a result, while the $C_{eq}$ of the entire capacitive circuit 200 is sufficient to handle a high applied voltage (a standard 5 V), the individual MOSFETs M1, M2 may be selected to handle less voltage. Since a capacitive circuit according to the principles disclosed herein is thus capable of employing MOSFETs rated for lesser voltages, thin gate dielectric MOSFETs, which are less expensive to manufacture than thick gate dielectric devices, may be employed to significantly reduce overall manufacturing cost. Moreover, circuit patterns having only thin gate dielectric MOSFETs (for use in typical low voltage (i.e., about 1.8 V) semiconductor circuits) may be employed by electrically interconnecting such MOSFETs as disclosed above, thus avoiding specialized processes for forming both thin and thick (i.e., low and high voltage) MOSFETs and simplifying the manufacturing process.

In addition, the resistive elements R1, R2 may be formed from a number of different materials. For example, the resistive elements R1, R2 may be constructed from, for example, polysilicon or silicon dioxide, by forming typical semiconductor resistors in the substrate and electrically connecting them to the stacked capacitive devices (i.e., MOSFETs M1, M2). In other embodiments, the resistive elements R1, R2 may be constructed simply using a substrate of the semiconductor wafer on which the capacitive circuit is constructed. Furthermore, in embodiments where low voltage MOSFETs are employed, one of a source and drain of such a MOSFET may be coupled to provide the desired resistive effect. Of course, as illustrated in FIG. 1, MOSFETs may be connected across M1 and M2 so that the channel defined between the source and drain of those MOSFETs provide the resistive amounts. Still further, a tub or well of a couple of MOSFETs may also be used as the resistive elements R1, R2, when properly coupled across M1 and M2. Those who are skilled in the pertinent field of art will easily understand the variety of ways in which various materials/devices may be electrically coupled across stack MOSFETs M1 and M2 to provide resistive elements R1, R2, and a capacitive circuit as disclosed herein is not limited to any particular one.

In these embodiments, a high value for R varies based on the application of the final semiconductor capacitive circuit. For example, if the maximum allowable current leakage for the application is about 100 μA (for example, when the capacitive circuit is used as a power decoupling capacitor), and the high voltage applied to the circuit is 5 V (i.e., high voltage application), then the minimum total (equivalent) resistance for R1, R2, etc. would be about 50 kΩ. In another example, if the capacitive circuit (functioning as a decoupling capacitor) is used as the load of an off-chip output buffer (or other similar application), and the maximum leakage is about 1 μA in a 5 V system, then the minimum equivalent resistance of R1, R2, etc. would be about 5 MΩ. Of course, a circuit according to the principles disclosed herein is not limited to any particular type of semiconductor application.

Also, while the above examples are shown where C1=C2 and R1=R2, the principles disclosed herein may also be incorporated in applications where these respective devices are not equivalent to one another. In such embodiments, equations (1) through (4) may be modified to separately calculate the equivalent capacitance for each of C1 and C2, based on the values of R1 and R2. As a result, such modifications will allow C1 and C2, and, additionally or alternatively, R1 and R, to more easily be located in different areas of the wafer. For example, C1 may have a capacitance equivalent to a first set of devices located in one area of the wafer, while C2 has a different capacitance that is equivalent to other similar devices in its own area. As a result, the principles disclosed herein allow even further variety in the creation of a capacitive circuit as disclosed herein. Those who are skilled in the relevant field of art will readily be capable of modifying the above equations for such applications.

Figure 3:
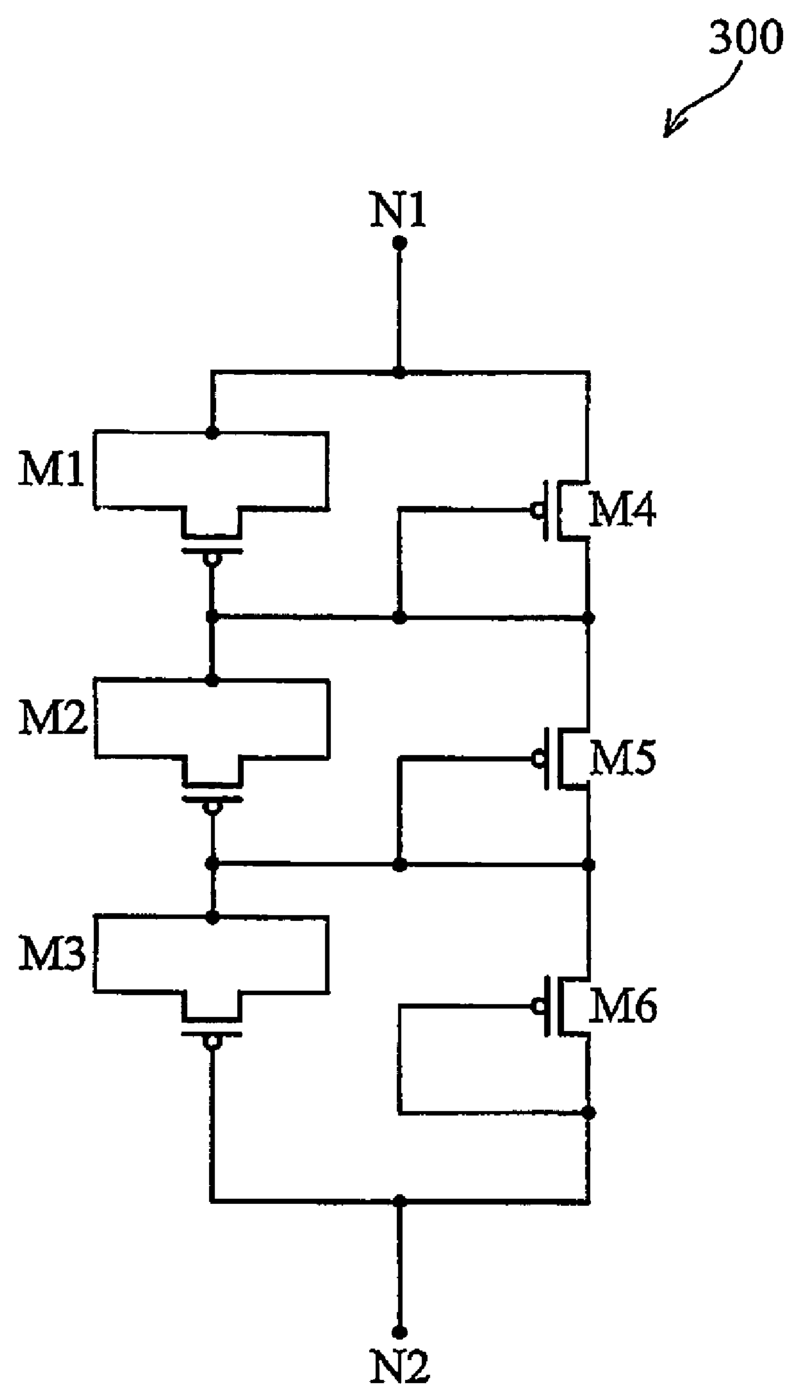
FIG. 3 illustrates another embodiment of a capacitive circuit that includes six MOSFET PMOS devices.

Looking now at FIG. 3, illustrated is another embodiment of a capacitive circuit 300 constructed according to the disclosed principles. This circuit 300 differs from the circuit 100 in FIG. 1 in that this circuit 300 includes six MOSFETs M1, M2, M3, M4, M5, M6 coupled together to create a decoupling capacitor for use in circuitry formed in semiconductor wafers. Similar to the previous embodiment, however, three of the MOSFETs M1, M2, M3 are stacked, while the remaining three MOSFETs M4, M5, and M6 form voltage dividers across the stacked devices.

More specifically, three of the MOSFETs (M1, M2 and M3) have their respective sources and drains (S/D) electrically coupled together. This first set of MOSFETs M1, M2, M3 are series-coupled to each other ("stacked") by electrically coupling the coupled S/D of M1 to a positive terminal of a power supply (at N1) and the gate of M1 to the coupled S/D of M2. The gate of M2 is then electrically coupled to the coupled S/D of M3, while the gate of M3 is then electrically coupled to a negative/ground terminal of the power supply (at N2). In this embodiment, the MOSFETs M1, M2, M3 are again PMOS devices (due to the orientation of their gates with respect to the power supply), but as before the orientation of M1, M2 and M3 may be reversed if NMOS devices are employed.

The remaining three MOSFETs M4, M5, M6 work as resistive elements each respectively coupled across MOSFETs M1, M2 and M3. More specifically, in this embodiment, one of the S/D of M4 is coupled to the S/D of M1, while the gate and other S/D of M4 are coupled to the gate of M1 and the S/D of M2. Likewise, one of the S/D of M5 is coupled to the gate of M1 and S/D of M2, while the gate and other S/D of M5 are coupled to the gate of M2. Finally, one of the S/D of M6 is coupled to the gate of M2 and S/D of M3, while the gate and other S/D of M6 are coupled to the gate of M3. The gate of M3 is also electrically coupled to the negative terminal (ground) of the power supply. As discussed above, coupling M4, M5 and M6 in this manner employs the resistive nature of the channel across the S/D regions of MOSFETs M4, M5 and M6 to form a voltage divider across the series-coupled MOSFETs M1, M2 and M3.

Although more low-voltage, thin-gate dielectric MOSFETs are employed in this embodiment than shown in the embodiment of FIG. 1, the relationship between the capacitances of M1, M2 and M3 to the applied voltage from the power supply is similar. Specifically, when the capacitances for each of M1, M2 and M3 are substantially equal and the resistances for each of M4, M5 and M6 are substantially equal, then the capacitance (C) of each of M1, M2, M3 are equal, and the equivalent capacitance ($C_{eq}$) is three times C. As is the case with any circuit constricted using the principles disclosed herein, any number of MOSFETs may be stacked in series, with a corresponding number of resistive elements (for example, more MOSFETs) coupled across the stacked MOSFETs, without limitation.

Figure 4:
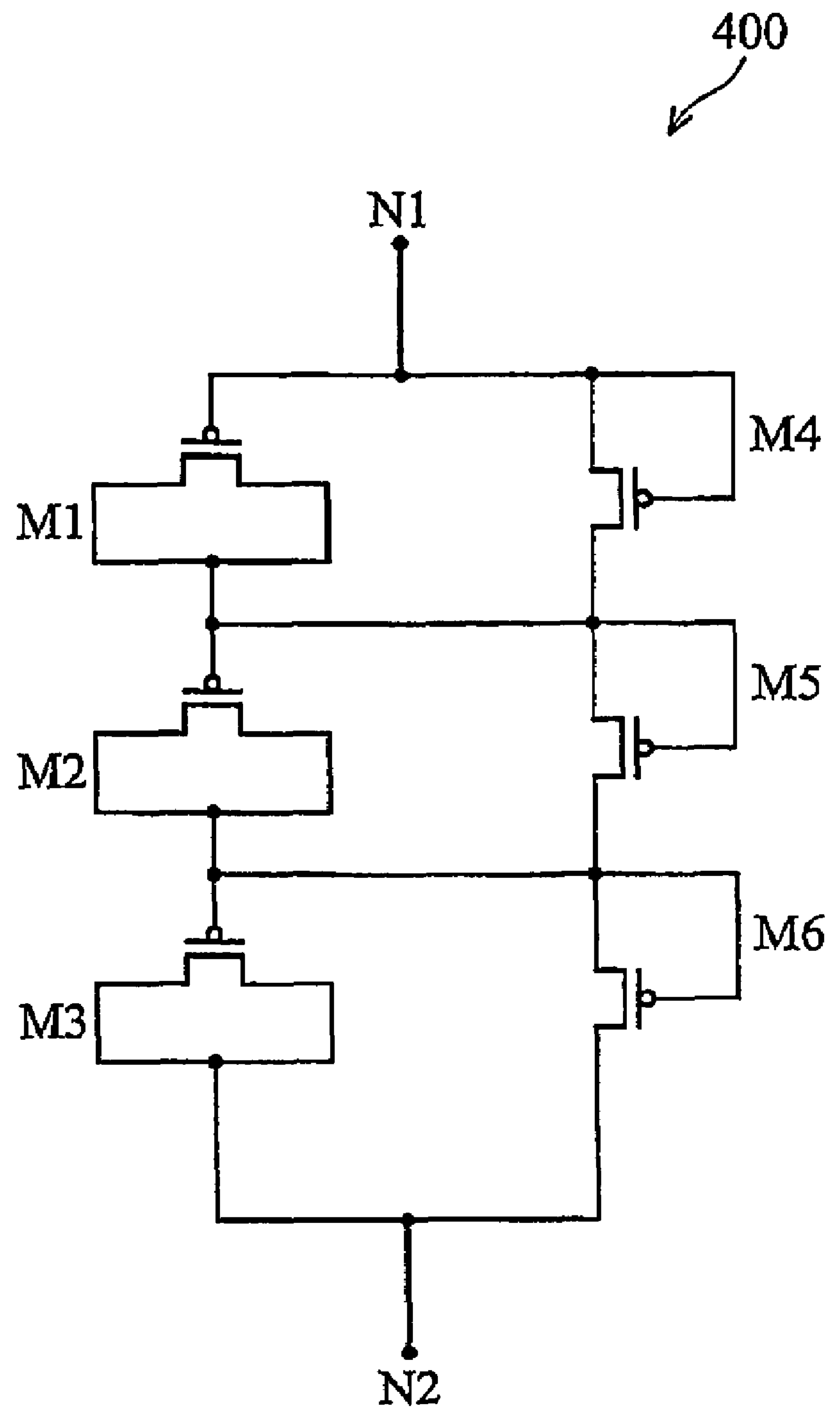
FIG. 4 illustrates another embodiment of a capacitive circuit having six MOSFET NMOS devices.

Looking now at FIG. 4, illustrated is yet another embodiment of a capacitive circuit 400 constructed according to the disclosed principles. Like the circuit 300 in FIG. 3, this circuit 400 includes six MOSFETs M1, M2, M3, M4, M5, M6 coupled together to create a decoupling capacitor for use in circuitry formed in semiconductor wafers. More specifically, three of the MOSFETs M1, M2, M3 are stacked, while the remaining three MOSFETs M4, M5, M6 form voltage dividers across the stacked devices. However, the arrangement of the devices in this circuit 400 is different than that found in the previous circuits discussed above.

As illustrated, the first three MOSFETs (M1, M2 and M3) still have their respective sources and drains (S/D) electrically coupled together, but in this embodiment, the gate of M1 is electrically coupled to the positive terminal of a power supply (at N1), with is coupled S/D coupled to the gate of M2. The coupled S/D of M2 is then electrically coupled to the gate of M3, while the coupled S/D of M3 is electrically coupled to the negative/ground terminal of the power supply (at N2). By reversing their direction in this manner, the stacked MOSFETs M1, M2, M3 may be NMOS devices (due to the orientation of their gates with respect to the power supply).

As before, the remaining three MOSFETs M4, M5, M6 work as resistive elements and are each respectively coupled across MOSFETs M1, M2 and M3. However, in this embodiment, the orientations of these resistive elements are also reversed, in accordance with the reversal of the M1, M2, M3. As a result, M4, M5 and M6 may also be NMOS devices. Although their orientation is reversed from the previous embodiments, coupling M4, M5 and M6 across M1, M2 and M3 (respectively) allows the resistive nature of the channels across the S/D regions of MOSFETs M4, M5 and M6 to form a voltage divider across the stacked MOSFETs M1, M2 and M3. Also as before, when the capacitances for each of M1, M2 and M3 are substantially equal and the resistances for each of M4, M5 and M6 are substantially equal, then the capacitance (C) of each of M1, M2, M3 are equal, and the equivalent capacitance ($C_{eq}$) is three times C. Moreover, any circuit constructed using NMOS devices, as disclosed in FIG. 4, may have any number of NMOS MOSFETs stacked in series, with a corresponding number of NMOS MOSFETs coupled across the stacked MOSFETs.

While various embodiments of capacitive circuits, and methods for manufacturing capacitive circuits, constructed according to the principles disclosed herein have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A capacitive circuit for use in a semiconductor device, the circuit comprising:

a first plurality of low voltage MOSFETs each having their respective source and drain electrically coupled together, the first plurality of MOSFETs series-coupled to each other by electrically coupling a gate of one of the plurality to the coupled source/drain of another of the first plurality;

a high voltage power supply electrically coupled to the first plurality of low voltage MOSFETs to provide a voltage higher than a maximum operating voltage of any one of the first plurality of low voltage MOSFETs, wherein a coupled source/drain of one of the first plurality of MOSFETs at a first end of the series electrically coupled to a first terminal of the the power supply, and a gate of another of the first plurality of MOSFETs at a second end of the series is electrically coupled to a second terminal of the power supply; and a plurality of resistive elements each electrically parallel-coupled across corresponding ones of the plurality of MOSFETs, the plurality of resistive elements comprising a second plurality of low voltage MOSFETs each having a gate and one of a source and drain electrically coupled together, the gate and the one of the source and drain of each of the second plurality electrically coupled to the gate of a corresponding one of the first plurality of low voltage MOSFETs, and the other of the source and drain of each of the second plurality electrically coupled to the coupled source/drain of the corresponding one of the first plurality of low voltage MOSFETs, wherein an equivalent capacitance of the coupled first plurality of low voltage MOSFETs is sufficient to operate under the voltage provided by the power supply.

2. A capacitive circuit according to claim 1, wherein the first plurality of low voltage MOSFETs each comprise a gate dielectric configured to be operated at only about 1.8 volts for about 10 years before breakdown.

3. A capacitive circuit according to claim 2, wherein the gate dielectrics comprise silicon dioxide and a thickness of about 40 Å.

4. A capacitive circuit according to claim 1, wherein each of the second plurality of low voltage MOSFETs each comprise a gate dielectric configured to be operated at only about 1.8 volts for about 10 years before breakdown.

5. A capacitive circuit according to claim 4, wherein the gate dielectrics comprise silicon dioxide and a thickness of about 40 Å.

6. A capacitive circuit according to claim 1, wherein the coupled source/drain of one of the first plurality of MOSFETs at the first end of the series is electrically coupled to a positive terminal of the power supply and the gate of another of the first plurality of MOSFETs at the second end of the series is electrically coupled to negative terminal of the power supply.

7. A capacitive circuit according to claim 1, wherein each of the first plurality of MOSFETs has substantially the same capacitance thereacross.

8. A capacitive circuit according to claim 7, wherein each of the first plurality of resistive elements has substantially the same resistance thereacross.

9. A capacitive circuit according to claim 1, wherein an applied voltage across the circuit substantially equals a sum of the voltage across each of the first plurality of MOSFETs

10. A capacitive circuit according to claim 1, wherein the first plurality of MOSFETs comprises two low voltage MOSFETs and the second plurality of MOSFETs comprises two low voltage MOSFETs, with the two low voltage MOSFETs of the second plurality corresponding to the two low voltage MOSFETs of the first plurality and coupled thereacross, the two corresponding low voltage MOSFETs of the second plurality forming a single voltage divider.

11. A capacitive circuit according to claim 1, wherein the plurality of MOSFETs comprises three low voltage MOSFETs and the second plurality of MOSFETs comprises three low voltage MOSFETs, with the three low voltage MOSFETs of the second plurality corresponding to the three low voltage MOSFETs of the first plurality and coupled thereacross, the three corresponding low voltage MOSFETs of the second plurality forming two voltage dividers.

12. A method of manufacturing a capacitive circuit on a semiconductor wafer, the method comprising:

forming a first plurality of low voltage MOSFETs on and in a semiconductor substrate, each of the MOSFETs separated by field oxide regions and having a source region and a drain region with a channel region defined therebetween, a gate dielectric over the channel, and a gate electrode over the gate dielectric;

electrically coupling the source region to the corresponding drain region of each of the first plurality of low voltage MOSFETs;

coupling in series each of the first plurality of MOSFETs by electrically coupling a gate of one of the first plurality to the coupled source/drain of another of the first plurality;

electrically coupling a first terminal of high voltage power supply to a coupled source drain of one of the first plurality of low voltage MOSFETs at a first end of the series of MOSFETs, and a second terminal of the power supply to a gate of another of the first plurality of MOSFETs at a second end of the series, to provide a voltage higher than a maximum operating voltage of any one of the first plurality of low voltage MOSFETs; and electrically coupling a plurality of resistive elements in parallel across corresponding ones of the first plurality of low voltage MOSFETs, wherein the plurality of resistive elements comprises a second plurality of low voltage MOSFETs each having a gate and one drain of each of the second plurality electrically coupled to the gate of a corresponding one of the first plurality of low voltage MOSFETs, and the other of the source and drain of each of the second plurality electrically coupled to the coupled source/drain of the corresponding one of the first plurality of low voltage MOSFETs, wherein an equivalent capacitance of the coupled first plurality of low voltage MOSFETs is sufficient to operate under the voltage provided by the power supply.

13. A method according to claim 12, wherein the first plurality of low voltage MOSFETs each comprise a gate dielectric configured to be operated at only about 1.8 volts for about 10 years before breakdown.

14. A method according to claim 13, wherein the gate dielectrics comprise silicon dioxide and a thickness of about 40 Å.

15. A method according to claim 12, wherein each of the second plurality of low voltage MOSFETs each comprise a gate dielectric configured to be operated at only about 1.8 volts for about 10 years before breakdown.

16. A method according to claim 15, wherein the gate dielectrics comprise silicon dioxide and a thickness of about 40 Å.

17. A method according to claim 12, wherein the coupled source/drain of one of the first plurality of MOSFETs at the first end of the series is electrically coupled to a positive terminal of the power supply and the gate of another of the first plurality of MOSFETs at the second end of the series is electrically coupled to a negative terminal of the power supply.

18. A method according to claim 12, wherein each of the first plurality of MOSFETs has substantially the same capacitance thereacross.

19. A method according to claim 18, wherein each of the plurality of resistive elements has substantially the same resistance thereacross.

20. A method according to claim 12,further comprising applying an applied voltage across the circuit substantially equal to a sum of the voltage across each of the first plurality of MOSFETs.

21. A method according to claim 12, wherein electrically coupling the plurality of resistive elements comprises electrically coupling two low voltage MOSFETs across two corresponding low voltage MOSFETs of the first plurality, the two corresponding low voltage MOSFETs forming a single voltage divider.

22. A method according to claim 12, wherein electrically coupling the plurality of resistive elements comprises electrically coupling three low voltage MOSFETs across three corresponding MOSFETs of the first plurality, the three corresponding low voltage MOSFETs forming two voltage dividers.

* * * * *

UNITED STATES PATENT AND TRADEMARK OFFICE

CERTIFICATE OF CORRECTION

PATENT NO. : 7,501,884 B2
APPLICATION NO. : 10/866155
DATED : March 10, 2009
INVENTOR(S) : Chung-Hui Chen It is certified that error appears in the above-identified patent and that said Letters Patent is hereby corrected as shown below:

Column 7, Line 36, insert -- is -- before "electrically"

Column 8, Line 18, delete "voltage" and insert in lieu thereof -- voltages --
Column 8, Line 50, insert -- a -- before "high"
Column 8, Line 51, delete "source drain" and insert in lieu thereof -- source/drain --
Column 8, Line 62, insert -- of a source and drain electrically coupled together, the gate and the one of the source and -- before "drain"

Column 10, Line 9, delete "voltage" and insert in lieu thereof -- voltages --

Signed and Sealed this

Twenty-seventh Day of July, 2010

David J. Kappos
*Director of the United States Patent and Trademark Office*